METHOD OF RENDERING NOBLE METAL CONDUCTIVE COMPOSITION NON-WETTABLE BY SOLDER
Filed June 18, 1965

INVENTORS
LEWIS F. MILLER
RICHARD K. SPIELBERGER

BY George O. Saile
ATTORNEY

United States Patent Office 3,401,126
Patented Sept. 10, 1968

3,401,126

METHOD OF RENDERING NOBLE METAL CONDUCTIVE COMPOSITION NON-WETTABLE BY SOLDER

Lewis F. Miller, Wappingers Falls, and Richard K. Spielberger, Hopewell Junction, N.Y., assignors to International Business Machines Corporation, Armonk, N.Y., a corporation of New York Filed June 18, 1965, Ser. No. 465,035
12 Claims. (Cl. 252—514)

ABSTRACT OF THE DISCLOSURE

A conductive metallizing composition which is adapted to be mixed with a non-reactive bonding frit and an inert liquid vehicle, deposited on an insulating substrate and fired to form a conductive element thereon is rendered not wettable by lead-tin solder by the addition of a metal oxide having a melting point greater than about 1000° C. and a powder oil absorption greater than about 10 lbs./100 lbs. or a material which converts during firing to form such metal oxide.

This invention relates to the microminiature circuits, and more particularly to highly conductive electrodes which are substantially not wetted by solder.

The microminiature circuit module is typically a one-half inch square substrate of only a fraction of an inch in thickness, having functional components on the surface electrically connected with printed wiring. The functional components are devices which include one or more active, passive or combinations of active and passive electrical circuit elements fabricated as an integrated circuit structure and capable of performing useful functions or operations. The active devices, as one example, secured to the substrate are generally in order of 25 x 25 mils. The printed conductive elements that connect the active and passive devices are in width approximately 5 to 15 mils or less and in thickness 0.5 to 1.5 mils.

The small cross section of the printed conductor element and its necessary closeness to the high-precision passive and active functional components presents severe limitations in the composition of the conductive element. The major requirement is that the conductive element be highly conductive because of the small cross section of the element. In the prior art printed conductive elements, conductive elements that were wettable with solder were exclusively used. After the printing of the conductive element on the substrate, the substrate was dipped in a solder bath and the printed conductive elements were coated with solder. The solder coating increased the conductivity of the printed conductor and was also used to attach the active and passive devices to the printed electrodes on the substrate. There are, however, disadvantages to the use of solder. The presence of large amounts of solder increases the weight of the module, adhesion of the printed electrodes is reduced due to solder alloying with portions of the electrode, and solder migration and bridging between the conductive electrodes can produce unusable circuit structures. It is seen, therefore, that the only place a wettable with solder electrode is necessary is at the points of connecting the passive and active chip devices to the printed conductors.

It is thus an object of this invention to provide a highly conductive electrode composed of a conductive metallizing composition and which is not wetted by tin-lead solder.

It is another object of this invention to provide a highly conductive electrode that is not wetted by tin-lead solder and which is easily applied to and fired on a dielectric substrate.

It is a further object of this invention to provide a highly conductive electrode having no adverse effect on the functional components which it electrically joins on a microminiaturized circuit module.

It is still a further object of this invention to provide a highly conductive electrode composed of principally noble metal having dispersed therein a metal oxide component that has the ability of preventing the noble metals from being wetted by a tin-lead solder.

These and other objects are accomplished in accordance with the broad aspects of the present invention by providing a conductive metalizing composition adapted to be deposited and fired on a dielectric substrate to form a conductive element thereon which is not wetted by tin-lead solder. The conductive electrode is a homogenous mixture of a major portion of a noble metal and a minor portion of a metal oxide. The metal oxide is one that has a melting point greater than about 1,000° C., a small particle size and an oil absorption value of greater than 10 lbs. per 100 lbs. A small quantity of vitreous flux may be dispersed in the composition to bind the metal particles together and to the dielectric substrate during the firing of the electrode. The quantity of the high melting point metal oxide is very small in comparison to the proportion of noble metal so that the wettability of the electrode by tin-lead solder is prevented without materially affecting the other properties of the conductive electrode.

The foregoing and other objects, features and advantages of the invention will be apparent from the following more particular description of the preferred embodiment of the invention, as illustrated in the accompanying drawings.

Figure 1:
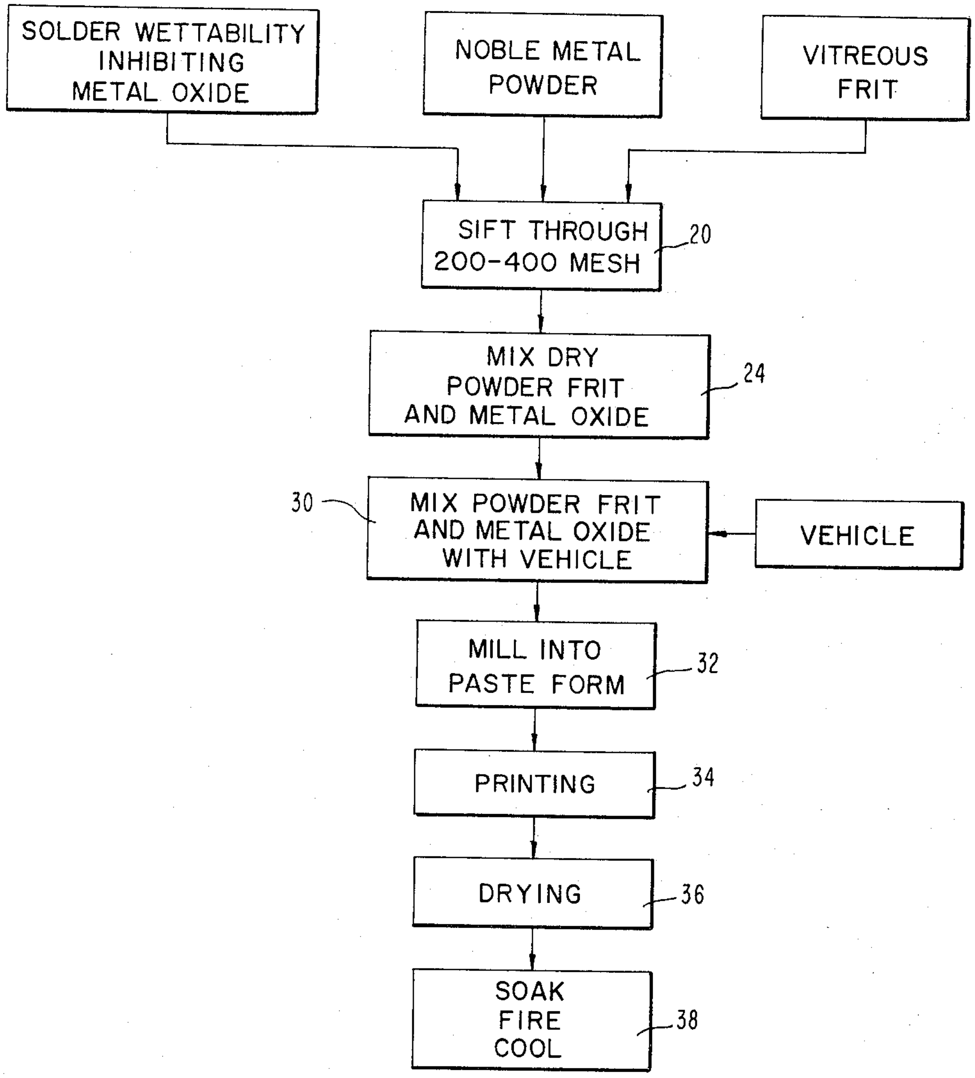
FIGURE 1 is a flow diagram illustrating the method required for fabricating the conductive electrode of the present inventions.

The highly conductive electrode is composed of a homogenous mixture of a noble metal and a very minor portion of a high melting point metal oxide. The most important characteristic of the electrode is high conductivity because of its intended use as a printed conductor having typically a width of 5 to 15 mils or less and a thickness of 0.5 to 1.5 mils. The conductors are, therefore, preferably largely composed of single or combinations of noble metals such as gold, silver, platinum and palladium. Additives of any kind to the conductors reduces the conductivity of the conductors and therefore they must be either avoided or used in extremely small amounts.

Reltaively low melting temperature metal oxides have been widely used as the binding agent or flux for noble metal printed and fired conductors. Typical of these metal oxide fluxes are bismuth trioxide, lead oxide, cadmium oxide, vanadium oxide, lithium carbonate, molybdenum trioxide, all of which have melting points in the range of 600 to 900° C. The addition of these materials in small quantities to the noble metal powder in no way inhibits the solderability of the acquired conductor, and in some cases enhances the solderability of the fired conductor. It was therefore surprising and totally unexpected that small amounts of finely divided higher melting point metal oxides, such as titanium dioxide, chromium trioxide, indium trioxide, silicon dioxide, aluminum oxide and barium oxide, when added to noble metal powder which is subsequently fired at a temperature below the melting point of the metal oxide, make the conductor completely nonwettable by lead-tin solders. Sporadic solder wettability is as undesirable as complete wettability because it can cause shorting of the semi-conductor device. Alternately salts of metals whose oxides have a melting temperature above 1,000° C. may be added to the paste as a solderability inhibiting ingredient since the salts are oxidized to the metal oxide during the firing of the electrode. It has also been discovered that silicone resin can be added to the paste formulation as a solderability inhibiting ingredient. The resin is oxidizing during the firing step to a finely dispersed silicon dioxide in the conductor. In general, the addition of the metal oxide solder inhibiting component is kept below 10 percent by weight of the final electrode composition and preferably below 5 percent by weight.

The effectiveness of the metal oxide is controlled not only by the chemical type, but also by the degree of dispersion of the small metal oxide particles among the metal particles in the electrode. The desired electrode surface is composed of very small alternating regions of metal and metal oxide, the metal oxide portions preventing solder from wetting the adjacent metal. The more finely divided and dispersed the metal oxide, the less weight or volume is required to prevent solder wettability. Several ways of expressing particle size can be employed among them: oil absorpiton (A.S.T.M.–D281), surface area by gas absorption (B.E.T. method), or particle size (centrifugal air classification). Oil absorption is the best method for rating metal oxide effectiveness, since it integrates particle size and represents an average of the surface size and shape of the metal oxide powder. High oil absorptions represent small well dispersed particles. This physical characteristic has proven a most effective measure of the metal oxide particle condition which prevents solderability. It would seem that high surface areas should also be desirable, but the opposite has proven true. Since high surface area implies high surface activity, particles having high surface area readily form agglomerate structures which are difficult to break apart. The individual particles are thereby bound together and are not available to be dispersed among the metal particles. A combination of high oil absorption and low agglomeration-forming tendency, as represented by relatively low surface area, is thus required.

The proportion of finely divided metal oxide required to prevent soldering varies among particular metals and alloys since various metal and metal alloys accept solder more or less readily. Thus, for example, silver: palladium alloys, which solder well, require more metal oxide to prevent tinning than gold: platinum alloys. For any metal system, however, non-solderability is attained with the minimum amount of metal oxide if the metal oxide has a high oil absorption and low surface area.

Colloidal silica is most effective with an oil absorption greater than 250 lbs./100 lbs., on a surface area under 200 meters$^2$/gm. Other diatomaceous silicate material requires an oil absorption over 500 lbs./100 lbs., with a surface area under 100 meters$^2$/gm.. Indium oxide is very effective with an oil absorption greater than 27 lbs. and a surface area under 100 meters$^2$/gm. In general, an oil absorption greater than 10 lbs./100 lbs. and surface area under 100 meters$^2$/gm. is preferred to produce the desired non-solder wettability result without unduly reducing conductivity. By using a minimum amount of metal oxide to prevent soldering, the conductor resistance is increased only a small amount. The preferred weight per cent colloidal silica used in conductive electrodes to stop solderability is 1 to 5 percent. The preferred percent by weight for other metal oxides are indium oxide—2 to 5 percent; chromium trioxide—4 to 10 percent; barium oxide—4 to 10 percent; copper titanate—5 to 10 percent; alumina—5 to 10 percent; colloidal silicate— 1 to 5 percent and titanium dioxide—9 to 10 percent. These cited non-soldering compositions show resistance increases under 50% compared to untreated similar conductors. This is acceptable for electrical circuitry .

If the binder frit reacts with the metal oxide, the reaction product does not prevent soldering as well as the unreacted oxide. For this reason, either non-reactive frit should be used or more oxide will be required.

Solderability may be regenerated if desired by abrading or polishing the surface of the fired conductor, to smear metal over the conductor surface. This covers the metal oxide particles with metal and permits good soldering.

Figure 2:
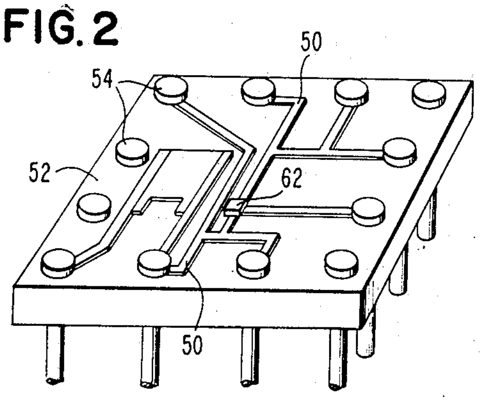
FIGURE 2 is a perspective illustration of a pattern of conductive electrodes on a ceramic substrate with a microminiature chip device attached to the conductive electrode pattern.

Referring now, more particularly, to the flow diagram of FIGURE 1 there is given a summary of the method of fabricating a conductive element pattern such as shown in FIGURE 2. The noble metal powder and vitreous frit and solder wettability inhibiting metal oxide are sifted through a 200 to 400 mesh screen using gentle shaking as indicated by step 20. Only powders passing through the screen are used in succeeding method steps to avoid the presence of large particles. The dry metal noble powder and metal oxide together with the vitreous frit are then placed in a non-contaminating container and are uniformly mixed as given by step 24 by means of a mechanical shaker shaking the container. The uniformly mixed noble metal powder, metal oxide and frit are now ready to be mixed with the vehicle.

The vehicle used for the noble metal powder mixture preferably includes a vaporizable solid, a resinous binder and a solvent for a vaporizable solid and binder. The vaporizable solid in the vehicle results in essential dimensional stability of the printed line. Examples of applicable vaporizable solids are terephthalic acid, furoic acid and ammonium compounds such as ammonium carbonate and ammonium sulfate. The binder material is used to retain the powders and frit on the substrate when the solvent and a vaporizable solid have been removed. Examples of binders include natural gums, synthetic resins, cellulose resinous materials and the like. The solvent imparts the desired viscosity to the printing paste. The solvent is selected so that it will dissolve the binder and dissolve or disperse the vaporizable solid used in the vehicle. Commonly used solvents are the higher boiling paraffins, cycloparaffins and aromatic hydrocarbons or mixtures thereof; or one or more of the mono- and di-alkyl ethers of diethylene glycol or their derivatives such a diethylene glycol monobutyl ether acetate. The elements of the vehicle are premixed into solution before mixing with metallic powder and vitreous frit. A complete description of the vehicle, its components and desirable properties is not included herein because it is the subject of the U.S. patent application Ser. No. 334,544, now abandoned filed Dec. 30, 1963, which is assigned to the assignee of the present invention and is fully described therein.

The premixed noble metal powder, metal oxide and frit are combined with the inert vehicle together with a suitable surfactant and are thoroughly and homogeneously mixed until a paste of the desired viscosity is formed in the method steps 30 and 32. Standard mixing apparatus may be used such as a mortar and pestle, a blade type mixer or the like. There is no need for attrition. The mixing phase 30 is needed only for homogeneity and to avoid breaking-out of metal powder in the subsequent milling operation. A three roll mill is preferably used to further disperse the metal powder in the vehicle. The mill temperature should not be allowed to raise much above room temperature to avoid excess volatilization of the vehicle. The paste is removed from the mill and is now ready for application to the substrate.

A conductive element is printed onto the dielectric substrate, such as the conductive element pattern 50 on substrate 52, in FIGURE 2, by silk screening or other conventional printing processes as step 34. The substrate is, of course, thoroughly cleaned and free from grease or other extraneous material before printing is attempted. A silk screen having the desired circuit pattern is placed over the clean substrate. The paste is squeegeed, doctored, or extruded onto the screen. Pressure is applied to spread the paste through the screen and onto the substrate. The pattern in the screen is reproduced as a thickness determined by a number of variables, for example, squeegee pressure and angle, paste viscosity, screen openings, and mask thickness. The screen is removed from the substrate and the printed metallizing paste composition is read to be dried and fired. The printed pattern is dried as indicated as drying step 36 at room temperature or above. Most of the liquid is thereby removed and the resulting printed pattern is a solid.

The firing step 38 includes a cycle of soaking, firing and cooling. The period during which the temperature of the printed paste on the substrate is gradually being increased to that of the firing temperature is called the soaking period. It is during the soaking period that the last traces of the solvent of the paste evaporate. Then, as the temperature increases, the vaporizable solid in the vehicle completely sublimes. Finally, the binder constituent is decomposed and substantially removed from the paste as gaseous combustion products. The vitreous frit fuses at or below the firing temperature to produce a durable fired conductive element pattern on the dielectric substrate. The firing temperature and time of firing, of course, is largely dependent upon the particular vitreous frit used. However, a minimum firing temperature is required where a noble metal oxide is included as the metal powder to allow the noble metal oxide to be reduced to the pure metal during firing. The dielectric substrate having the now fused pattern of conductive elements is brought to room temperature.

Figure 3:
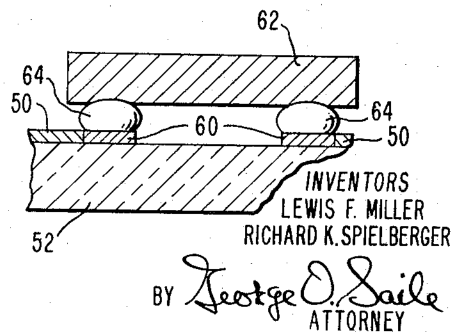
FIGURE 3 is a cross-sectional close-up illustration of the microminiature chip device to conductive electrode connection shown in FIGURE 2.

Microminiature chip components may be attached to the pattern by the method described in copending U.S. patent application Ser. No. 465,034 filed June 18, 1965, and assigned to the assignee of the present invention. Briefly with reference to FIGURES 2 and 3, the method comprises applying a second conductive pattern 60 that can be soldered to the pattern 50 only at the connecting areas. The substrate is dipped into a solder bath. The solder coats only the conductive metallic pattern 60. The microminiature chip device 62 has solder contacts 64 extending therefrom. The device 62 is placed onto the solder and the assemblage is heated to the melting temperature of the solder where at the solder 64 from the device and the solder from the substrate forms a unitary globule. The globule is formed due to surface tension phenomena and supports the device 62 from the substrate 52 even when fluid. The solder is then cooled to form the completed supported microminiature device.

EXAMPLES 1 THROUGH 7

The noble metal powders in all cases had a powder surface area in the order of 2–20 square meters per gram. Each quantity of powder was individually sifted through a 400 mesh screen. A lead borosilicate glass frit having the following composition given in parts by weight was sifted through a 400 mesh screen:

| | |
|---|---|
| Silicon dioxide ($SiO_2$) | 22.35 |
| Lead oxide (PbO) | 66.6 |
| Aluminum oxide ($Al_2O_3$) | 2.3 |
| Boron trioxide ($B_2O_3$) | 8.75 |

The colloidal silica was also sifted through a 400 mesh screen.

The following formulation, in parts by weight, using only the powders which passed the 400 mesh screen, was made up for each of the examples.

| | |
|---|---|
| Noble metal powder plus colloidal silica | 98 |
| Lead borosilicate glass frit | 2 |

The noble metal or alloys used and the proportion of colloidal silica in the mixture was varied in each example as shown in the Table I. Certain other important properties are shown in the Table I.

TABLE I

| Example | Noble Metal Parts Weight | Colloidal Silica Parts by Weight | Silica Surface Area in m.²/gm. | Silica Average Particle size in Microns | Silica oil Absorption in lbs., oil/100 lbs. | Solder Wettability |
|---|---|---|---|---|---|---|
| 1 | 80 Ag: 20 Pd | 3 | 175–200 | 0.02 | 250–300 | None. |
| 2 | Pt | 1 | 175–200 | 0.02 | 250–300 | Do. |
| 3 | Au | 1 | 175–200 | 0.02 | 250–300 | Do. |
| 4 | 80 Ag: 20 Pd | 3 | 300 | 3.3 | 300 | Almost none. |
| 5 | 80 Ag: 20 Pd | 3 | 340 | 2.9 | 225 | Sporadic. |
| 6 | 80 Ag: 20 Pd | 3 | 260 | 10 | 145 | Do. |
| 7 | 80 Ag: 20 Pd | 3 | 700 | 10 | 95 | Solders. |

The dry metal powders and frit were individually weighed out and placed in their respective noncontaminating glass jars for each example. Each of the formulations were mixed for two hours in their respective jars by means of a mechanical shaker. The formulations were by that time homogeneously mixed.

A vehicle for the conductive metallizing paste was made up of the following constituents given in parts by weight:

| | |
|---|---|
| Diethylene glycol monobutyl ether acetate | 77 |
| Ethyl cellulose | 16 |
| 2-furoic acid | 7 |

These ingredients were agitated in a closed high kinetic energy disperser until all of the ethyl cellulose was dissolved. The temperature of the mix was maintained at below 80° C.

The premixed metal powders and frit for each example were combined with the vehicle together with Igepal CO430 surfactant and individually mixed with a mortar and pestle until completely wetted. The following were the parts by weight solid constituent and liquid constituent used for each example:

| | |
|---|---|
| Solids constituent | 78 |
| Vehicle | 20.9 |
| Igepal CO430 [an alkylphenoxypoly (ethyleneoxy) ethanol surfactant | 1.1 |

In each case the wetted material was taken from the mortar and further individually mixed on a three roll mill for 10 passes to further disperse the pigment in the vehicle. The printing paste was removed from the mill and mixed with a spatula to insure uniformity.

Dielectric ceramic substrates composed of 95 percent alumina were thoroughly cleaned by immersion in trichloroethylene. The pastes for each of the examples were applied to their respective ceramic substrates through a silk screen having a 325 mesh size by means of a rubber squeegee. The squeegee was urged against the screen to spread the paste through the screen and onto the substrata to take the pattern of the screen. The screens were removed and the substrate and metallic paste for each example was fired in an oven at 750° C. The soak-fire-cool cycle used was 30–15–30 minutes. The pattern was continuous and excellent in appearance.

The ceramic dielectric substrates having the conductive element pattern on their surfaces were then cleaned by immersion in ultrasonically agitated trichloroethylene for 10 minutes. The cleaned substrates were each dipped into rosin flux for 5 seconds. They were next dipped into a solder bath maintained at 625° F. for 5 seconds. Other substrates were dipped into the same tinning bath for 15 seconds. The composition of the tinning bath was 90 percent by weight lead and 10 percent by weight tin. There was no sign of any coating of the lead-tin composition on the conductive element patterns of Examples 1, 2 and 3 as indicated in the Table I. However, all other conductive pattern examples were wetted with solder in some degree as given in Table I. The patterns of Examples 1, 2 and 3 were dipped into two other solder baths using the procedure described for the 90 lead:10 tin bath. The solder bath compositions were 97.5 lead:1.75 silver:0.75 tin and 60 lead:40 tin.

The results show the need for regulation of both oil absorption and surface area of the metal oxides. The highly acceptable Examples 1, 2 and 3 all use silica having high oil absorption and moderately high surface area values. The unacceptable Example 4 used silica having an oil absorption value as high as the Examples 1, 2 and 3, but the surface area of the silica was substantially higher. The unacceptable Examples 5, 6 and 7 used silica with higher surface area and lower oil absorption values than Examples 1, 2 and 3. The poorest results were obtained in Example 7 wherein silica having the highest surface area and lowest oil absorption values were used.

EXAMPLES 8 THROUGH 11

The procedures of Examples 1 through 7 were followed in making up the pastes, printing the conductive elements on the dielectric substrates, and firing the printed elements which represent Examples 4 through 7. The noble metal or alloy used in all cases had a powder surface area in the order of 2 to 20 square meters per gram. The noble metal or alloy used and the proportion of indium oxide in the mixture was varied in each example as shown in Table II. Certain important properties of the indium oxide are also given in Table II.

TABLE II

| Example | Noble Metal Parts by Weight | Indium Oxide Parts by Weight | Surface Area in m.²/gm. | Indium Oxide, Average Particle size in microns | Indium Oxide, Oil Absorption in lbs., oil/100 lbs. | Solder Wettability |
|---|---|---|---|---|---|---|
| 8 | 90 Au:10 Ag | 3 | 60 | 0.02 | 27 | None. |
| 9 | 80 Ag:20 Cu | 3 | 60 | 0.02 | 27 | Slight traces |
| 10 | 80 Ag:20 Pd | 4 | 60 | 0.02 | 27 | None. |
| 11 | Au | 3 | 60 | 0.02 | 27 | Do. |

The ceramic dielectric substrates having the conductive pattern on their surfaces were cleaned, dipped in a rosin flux and dipped in a 90 lead-10 solder bath. The solder did not wet the conductive electrodes as indicated in the Table II.

EXAMPLES 12 THROUGH 15

The procedures of Examples 1 through 7 were followed in printing the conductive elements on the dielectric substrates and firing the printed elements which represent Examples 8 through 11. A gold-platinum paste was used which contained 55 percent by weight gold, 15 percent by weight platinum, 9 percent by weight bismuth trioxide and 1 percent by weight cadmium borosilicate glass. The vehicle used was composed of ethyl cellulose and beta terpineol. The particular metal oxide inhibiting ingredient used its oil absorption value and the variation of the amount of the metal oxide ingredient in each example is shown in Table III. The barium acetate is substantially reduced in particle sized during the mixing operations so initial powder surface area, particle size and oil absorption values would not be meaningful, they are not given.

TABLE III

| Example | Au:Pt in Parts by Weight | Metal Oxide Parts by Weight | Oil Absorption in lbs., oil/100 lbs. | Solder Wettability |
|---|---|---|---|---|
| 12 | 80:20 | 6 Cu $TiO^3$ | 10-14 | None. |
| 13 | 80:20 | 6 Alumina | 65 | Do. |
| 14 | 80:20 | 10 $TiO^2$ | 15 | Do. |
| 15 | 80:20 | 5 Ba Acetate | | Do. |

The ceramic dielectric substrates having the conductive pattern on their surfaces were cleaned, dipped in a rosin flux and dipped in different solder baths as described in the other examples. The solders did not wet the conductive electrodes as indicated in the Table III.

EXAMPLES 16 AND 17

The procedures of Examples 1 through 7 were followed in making up the pastes, printing the conductive elements on the dielectric substrates and firing the printed elements which represent this group of examples. The powder surface area of the gold powder used in these examples was 2 m.²/gm. The particular metal oxide inhibiting ingredient used, the certain important properties of the ingredient and variation of the amount of the metal oxide ingredient in each example is shown in Table IV. The barium acetate and chromium oxide are substantially reduced in particle size during the mixing operations so initial powder surface area, particle size and oil absorption values would not be meaningful so they are not given.

TABLE IV

| Example | Noble Weight | Metal Oxide Parts by Weight | Solder Wettability |
|---|---|---|---|
| 16 | Au | 5 $Cr_2O_3$ | None. |
| 17 | Au | 5 Ba Aceta-te | Do. |

The ceramic dielectric substrates having the conductive pattern on their surfaces were cleaned, dipped in a rosin flux and dipped in different solder baths as described in the other example. The solders did not wet the conductive electrodes as indicated in Table IV.

EXAMPLE 18

The procedures of Examples 1 through 7 were followed in making up the pastes, printing the conductive elements on the dielectric substrates and firing the printed elements. The silver powder had a 0.7 square meter per gram powder surface area and palladium a powder surface area of 15 to 25 square meters per gram. The vitreous flux used was a combination of equal parts of barium fluoride and barium borate. A silicate resin was used as the resinous component and the ingredient which when oxidized forms the finely dispersed silica that prevents solderability. The formulation was in parts by weight.

Solids:

| | |
|---|---|
| Silver powder | 60 |
| Palladium powder | 15 |
| Barium fluoride | 2 |
| Barium borate | 2 |

Liquid:

| | |
|---|---|
| Silicone resin (Dow Corning R–5071) | 17 |
| Diethylene glycol monobutyl ether acetate | 3 |
| Igepal CO430 [an alkylphenoxypoly(ethyleneoxy) ethanol surfactant] | 3 |

The ceramic dielectric substrates having the conductive pattern on their surfaces were cleaned, dipped in flux and, in turn, in different solder baths as described in the other examples. The solders did not wet the electrodes.

The invention thus provides a non-solderable conductive element and a method for making the element that is highly conductive, yet not wetted with solder, even in widths of 5 mils or less and thicknesses of 1 mil. The element has no adverse effect on the functional components which may be attached to it.

While the invention has been particularly shown and described with reference to preferred embodiments thereof, it will be understood by those skilled in the art that the foregoing and other changes in form and details may be made therein without departing from the spirit and scope of the invention.

What is claimed is:

1. The method of forming a conductive element that is not wet by solder on an insulating substrate which includes the steps of:

(A) providing a conductive metallizing composition comprising (1) a homogeneous mixture of (a) a conductive constituent selected from the group consisting of (i) a noble metal, and (ii) a noble metal alloy, and (b) a solder inhibiting agent selected from the group consisting of (i) the oxide of a metal selected from the group consisting of titanium, chromium, indium, silicon, aluminum and barium, and (ii) a material which forms said metal oxide during firing, (c) said metal oxide having a melting point greater than about 1000° C. and a powder oil absorption greater than about 10 lbs. oil/100 lbs. metal oxide, (2) the amount of said agent comprising at least 1% but not more than 10% of said mixture;

(B) depositing said composition on said substrate in a desired pattern; and (C) firing to form said element.

2. The method according to claim 1 wherein said composition includes a vitreous frit.

3. In the method of depositing a conductive metallizing composition on an insulating substrate and firing to form a conductive element, the improvement comprising:

(A) adding to said metallizing composition a solder inhibiting agent selected from the group consisting of (1) a metal oxide having a melting point greater than about 1000° C., and a powder oil absorption greater than about 10 lbs. oil/100 lbs. metal oxide, and (2) a material which forms said metal oxide during firing;

(B) the amount of said agent comprising at least 1% but not more than 10% of said composition.

4. The method of claim 2 wherein said noble metal comprises gold and said metal oxide comprises from about 1.0 percent to 5 percent by weight of said mixture.

5. The method of claim 2 wherein said noble metal comprises gold and said metal oxide is chromium trioxide and it comprises from about 4 percent to 10 percent by weight of said mixture.

6. The method of claim 2 wherein said noble metal comprises gold and said metal oxide is barium oxide and it comprises from about 4 percent to 10 percent by weight of said mixture.

7. The method of claim 2 wherein the said noble metal comprises a gold-platinum alloy and said metal oxide comprises from about 5 percent to 10 percent by weight of said mixture.

8. The method of claim 2 wherein the said noble metal comprises a gold-platinum alloy and said metal oxide is alumina and it comprises from about 5 percent to 10 percent by weight of said mixture.

9. The method of claim 2 wherein the said noble metal comprises a gold-platinum alloy and said metal oxide is titanium dioxide and it comprises from about 9 percent to 10 percent by weight of said mixture.

10. The method of claim 2 wherein the said noble metal comprises a gold-platinum alloy and said metal oxide is barium oxide and it comprises from about 4 percent to 10 percent by weight of said mixture.

11. The method of claim 2 wherein said noble metal comprises a silver-palladium alloy and said metal oxide is colloidal silica and it comprises from about 1 percent to 5 percent by weight of said mixture.

12. The conductive method of claim 2 wherein said noble metal comprises a silver-palladium alloy and said metal oxide is colloidal silicate and it comprises from about 1 percent to 5 percent by weight of said mixture.

References Cited

UNITED STATES PATENTS

| | | | |
|---|---|---|---|
| 3,085,876 | 3/1963 | Alexander et al. | 75—206 |
| 3,149,002 | 9/1964 | Place et al. | 252—514 |

LEON D. ROSDOL, *Primary Examiner.*

J. D. WELSH, *Assistant Examiner.*